United States Patent
Lee

(10) Patent No.: US 9,666,837 B2
(45) Date of Patent: May 30, 2017

(54) MASK FOR DEPOSITION

(71) Applicant: Samsung Display Co., Ltd., Yongin, Gyeonggi-Do (KR)

(72) Inventor: Sang Yun Lee, Cheonan-si (KR)

(73) Assignee: SAMSUNG DISPLAY CO., LTD, Gyeonggi-Do (KR)

( * ) Notice: Subject to any disclaimer, the term of this patent is extended or adjusted under 35 U.S.C. 154(b) by 212 days.

(21) Appl. No.: 14/217,875

(22) Filed: Mar. 18, 2014

(65) Prior Publication Data
US 2015/0007768 A1   Jan. 8, 2015

(30) Foreign Application Priority Data

Jul. 8, 2013   (KR) .................. 10-2013-0079827

(51) Int. Cl.
| | | |
|---|---|---|
| B05C 21/00 | (2006.01) | |
| H01L 51/56 | (2006.01) | |
| C23C 14/04 | (2006.01) | |
| B05B 15/04 | (2006.01) | |
| H01L 51/00 | (2006.01) | |

(52) U.S. Cl.
CPC ............ H01L 51/56 (2013.01); B05C 21/005 (2013.01); C23C 14/042 (2013.01); *B05B 15/045* (2013.01); *H01L 51/0011* (2013.01)

(58) Field of Classification Search
None
See application file for complete search history.

(56) References Cited

U.S. PATENT DOCUMENTS

2004/0104197 A1*  6/2004  Shigemura ............ C23C 14/042
                                                              216/20
2012/0266813 A1*  10/2012  Hong .................... C23C 14/044
                                                              118/505

FOREIGN PATENT DOCUMENTS

| KR | 1020040047556 A | 6/2004 |
| KR | 1020080011571 A | 2/2008 |
| KR | 1020120069397 A | 6/2012 |
| KR | 1020120122908 A | 11/2012 |

* cited by examiner

*Primary Examiner* — Dah-Wei D Yuan
*Assistant Examiner* — Jethro M Pence
(74) *Attorney, Agent, or Firm* — Cantor Colburn LLP

(57) ABSTRACT

A mask for deposition includes a plurality of deposition pattern parts arranged spaced apart from each other in a first direction, and a plurality of pattern openings defined in each deposition pattern part; a plurality of dummy pattern parts disposed at opposing sides of the plurality of deposition pattern parts in the first direction, respectively, and a plurality of recesses defined in each dummy pattern part; and a plurality of fixing parts respectively disposed at external sides of outermost dummy pattern parts among the plurality of dummy pattern parts, in the first direction. A maximum thickness of the each dummy pattern part is equal to or larger than a maximum thickness of the each deposition pattern part, and is smaller than a maximum thickness of each fixing part.

9 Claims, 6 Drawing Sheets

MASK FOR DEPOSITION

This application claims priority to Korean Patent Application No. 10-2013-0079827 filed on Jul. 8, 2013, and all the benefits accruing therefrom under 35 U.S.C. 119, the contents of which in its entirety are herein incorporated by reference.

BACKGROUND

1. Field

The invention relates to a mask for deposition.

2. Description of the Prior Art

An organic light emitting diode display among the display devices is a self-emission display device, and has advantages of a wide viewing angle, excellent contrast, and a rapid response speed, thereby attracting attention as a next-generation display device.

The organic light emitting display includes an intermediate layer including at least a light emitting layer, between electrodes facing each other. The electrodes and the intermediate layer may be formed by various methods, and one of the methods is a deposition method.

In order to manufacture the organic light emitting display by the deposition method, a thin film with a desired pattern is formed by closely contacting a mask for deposition to a substrate, and depositing a deposition material on the substrate through the mask for deposition. The mask, for example, may be a fine metal mask ("FMM"), in which an opening is defined to have the same pattern as a pattern of the thin film to be formed on the substrate.

SUMMARY

A mask for deposition includes a deposition pattern part in which an opening part is defined, and an outer peripheral region in which the opening part is not defined, at an outer side of the deposition pattern part. However, a wrinkle may be generated at a boundary portion between the deposition pattern part and the outer peripheral region due to a sharp difference of a volume (or an average thickness) between the deposition pattern part in which the opening part is defined and the outer peripheral region in which no opening part is defined.

The wrinkle causes a lifting phenomenon between the mask for deposition and the substrate, thereby degrading adhesive force between the mask for deposition and the substrate. Where the adhesive force between the mask for deposition and the substrate is degraded, a shadow phenomenon, in which a deposition material is further deposited on an external side of a border of a thin film, may be generated when the thin film with a desired pattern is formed by depositing a deposition material on a substrate through the mask for deposition. Accordingly, a thin film deposition defect of the substrate may be generated. Therefore, there remains a need for an improved mask for deposition for use in forming a thin film on a substrate.

One or more embodiment of the invention provides a mask for deposition capable of decreasing a generation of a thin film deposition defect by improving adhesive force between the mask for deposition and the substrate to decrease an occurrence of a shadow phenomenon.

Technical problems of the invention are not limited to the above-mentioned technical problems, and other technical problems, which are not mentioned above, can be clearly understood by those skilled in the art from the following descriptions.

According to an embodiment of the invention, there is provided a mask for deposition including a plurality of deposition pattern parts arranged spaced apart from each other in a first direction, and a plurality of pattern openings defined in each deposition pattern part; a plurality of dummy pattern parts disposed at opposing sides of the plurality of deposition pattern parts in the first direction, respectively, and a plurality of recesses defined in each dummy pattern part; and a plurality of fixing parts respectively disposed at external sides of outermost dummy pattern parts among the plurality of dummy pattern parts, in the first direction. A maximum thickness of the each dummy pattern part is equal to or larger than a maximum thickness of the each deposition pattern part, and is smaller than a maximum thickness of each fixing part.

According to another embodiment of the invention, there is provided a mask for deposition a plurality of deposition pattern parts arranged spaced apart from each other in a first direction, and a plurality of pattern openings defined in each deposition pattern part and including: first pattern openings open at a first surface of the mask, and second pattern openings respectively connected with the first pattern openings, disposed under the first pattern openings in a thickness direction of the mask, and open at a second surface of the mask opposite to the first surface; a plurality of dummy pattern parts disposed at opposing sides of the plurality of deposition pattern parts in the first direction, respectively, and a plurality of recesses defined in each dummy pattern part and open at a same surface of the mask as the first pattern openings are open; and a plurality of fixing parts respectively disposed at external sides of outermost dummy pattern parts among the plurality of dummy pattern parts, in the first direction.

According to still another embodiment of the invention, there is provided a mask for deposition including a plurality of deposition pattern parts spaced apart from each other in a first direction, and a plurality of pattern openings defined in each deposition pattern part; a plurality of dummy pattern parts disposed at opposing sides of the plurality of deposition pattern parts in the first direction, respectively, and a plurality of recesses defined in each dummy pattern part; and a plurality of fixing parts respectively disposed at external sides of outermost dummy pattern parts among the plurality of dummy pattern parts, in the first direction. An average thickness of the each dummy pattern part is larger than an average thickness of the each deposition pattern part, and is smaller than an average thickness of each fixing part.

The embodiments of the invention have at least the following effects.

One or more embodiment of the mask for deposition according to the invention includes each deposition pattern part including a plurality of pattern openings, each dummy pattern part including a plurality of recesses, and a plurality of fixing parts, so that the volume (or average thickness) is not sharply changed from the deposition pattern part to the fixing part, but is changed by stages, thereby decreasing a generation of a wrinkle due to a sharp difference of a volume (average thickness) between the deposition pattern part and the fixing part.

Accordingly, in the mask for deposition according to the invention, a lifting phenomenon between the mask for deposition and the substrate is decreased during the deposition process, so that when the thin film with a desired pattern is formed by depositing the deposition material on the substrate, the occurrence of the shadow phenomenon in which a deposition material is further deposited on an external side of a border of the thin film is minimized, thereby decreasing thin film deposition defect of the substrate.

The effects according to the invention are not limited to the contents exemplified above, and more various effects are included in the specification.

BRIEF DESCRIPTION OF THE DRAWINGS

The above and other features and advantages of the invention will become more apparent by describing in detail embodiments thereof with reference to the attached drawings in which.

DETAILED DESCRIPTION

Figure 1:
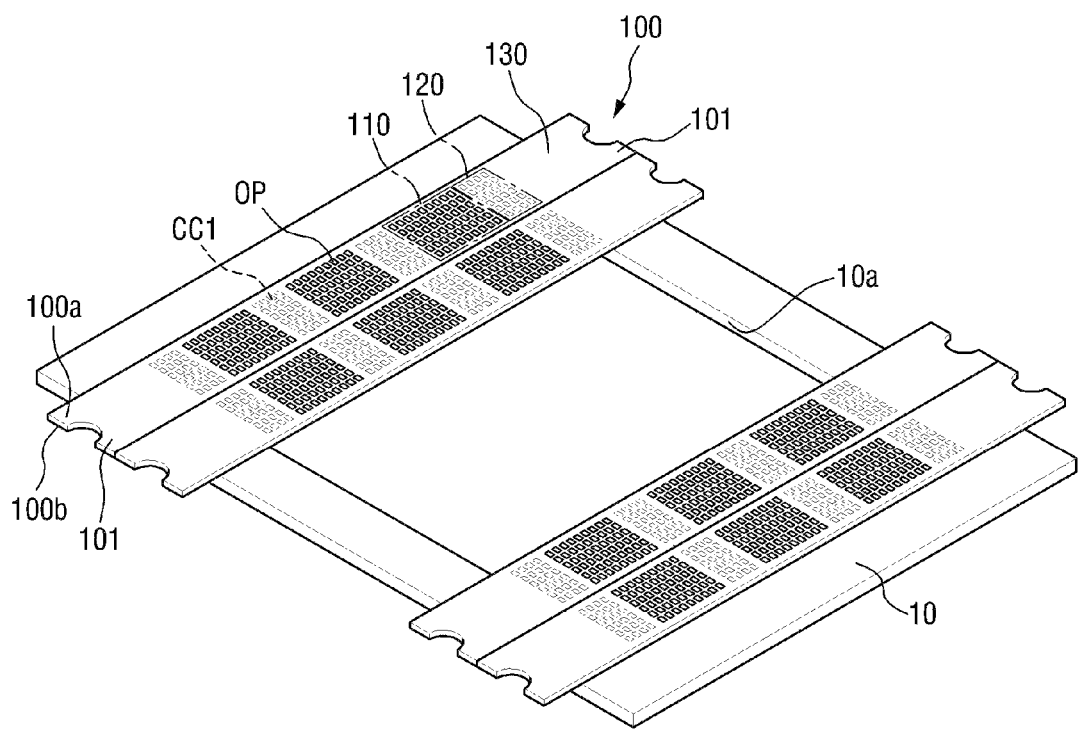
FIG. 1 is a perspective view of an embodiment of a mask for deposition disposed on a mask frame according to the invention.

Advantages and features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey the invention to those skilled in the art, and the invention will only be defined by the appended claims.

It will also be understood that when a layer is referred to as being "on" another layer or substrate, it can be directly on the other layer or substrate, or intervening layers may also be present. The same reference numbers indicate the same components throughout the specification. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, embodiments of the invention will be described with reference to the drawings.

FIG. 1 is a perspective view of an embodiment of a mask for deposition disposed on a mask frame according to the invention.

Referring to FIG. 1, a mask 100 for deposition is disposed on a mask frame 10. The mask 100 and the mask frame 10 may be coupled to each other such as by welding, to form a mask assembly.

The mask frame 10 forms an outer frame of the mask assembly, and may have a shape of a square frame. A frame opening 10a is defined at a center thereof. The mask frame 10 may support the mask 100 for deposition, and may be coupled with the mask 100 for deposition, such as by welding. The mask frame 10 may include a material having high rigidity, for example, a metal such as stainless steel.

The mask 100 for deposition may include a first surface 100a, and a second surface 100b opposing the first surface 100a. The first surface 100a may face and be in contact with a substrate (S in FIG. 6) when the substrate (S in FIG. 6) is disposed on the mask 100 for deposition in order to form a desired pattern of a thin film by depositing a deposition material on the substrate (S of FIG. 6). The second surface 100b may be in contact with an upper surface of the mask frame 10 when the mask 100 for deposition is coupled with the upper surface of the mask frame 10 so as to cover and overlap the frame opening 10a of the mask frame 10.

The mask for deposition 100 may include clamping parts 101 protruding from opposing ends thereof. The clamping parts 101 are parts to which coupling clamps (not illustrated) are coupled. The coupling clamps tension the mask 100 for deposition in directions of the opposing ends thereof. In an embodiment of forming a thin film on a substrate, the coupling clamps may be coupled to the clamping parts 101, before the mask for deposition 100 is coupled to the mask frame 10, such as by welding. A portion of the clamping parts 101 may be removed from a remainder of the mask 100 for deposition, after the coupling clamps are coupled to the clamping parts 101 such as by the welding process.

The mask 100 for deposition may be a metal thin film and may include nickel (Ni), a nickel alloy, a nickel-cobalt alloy, and the like. In FIG. 1, the collective mask for deposition indicated by reference numeral 100 includes a plurality of discrete and separate masks, but the invention is not limited thereto. In an alternative embodiment, the overall mask for deposition may be a single discrete mask having a size corresponding to a total size of the plurality of separated masks illustrated in FIG. 1. As used herein, reference numeral 100 may be used to indicate both a discrete mask (FIG. 2) and a collective mask including a plurality of discrete masks (FIG. 1).

The mask 100 for deposition may include a plurality of deposition pattern parts 110 in which a plurality of pattern openings OP are defined, a plurality of dummy pattern parts 120 in which a plurality of recesses CC1 are defined, and a plurality of fixing parts 130. A group of pattern openings OP may define a deposition pattern part 110. A group of recesses CC1 may define a dummy pattern part 120.

The plurality of pattern openings OP passes through the first surface 100a and the second surface 100b of the mask 100 for deposition, and completely through a cross-sectional thickness of the mask 100 for deposition. The plurality of pattern openings OP may correspond to the frame opening 10a of the mask frame 10 when the mask 100 for deposition is coupled to the mask frame 10. In an embodiment, where a red organic light emitting layer among the red organic light emitting layer, a green organic light emitting layer and a blue organic light emitting layer of an organic light emitting diode display is formed on a substrate S, the plurality of pattern openings OP may be defined at a position corresponding to a pattern of the red organic light emitting layer. In FIG. 1, it is illustrated that the plurality of pattern openings OP is defined in dot shapes, but may be defined in slit shapes, and the invention is not limited thereto. In another embodiment, the plurality of pattern openings OP may be defined in both dot shapes and slit shapes.

The plurality of recesses CC1 may be extended from on the second surface 100b of the mask 100 for deposition, and may correspond to the frame opening 10a of the mask frame 10 when the mask 100 for deposition is coupled to the mask frame 10.

The plurality of deposition pattern parts 110, the plurality of dummy pattern parts 120, and the plurality of fixing parts 130 will be described in more detail below.

Figure 2:
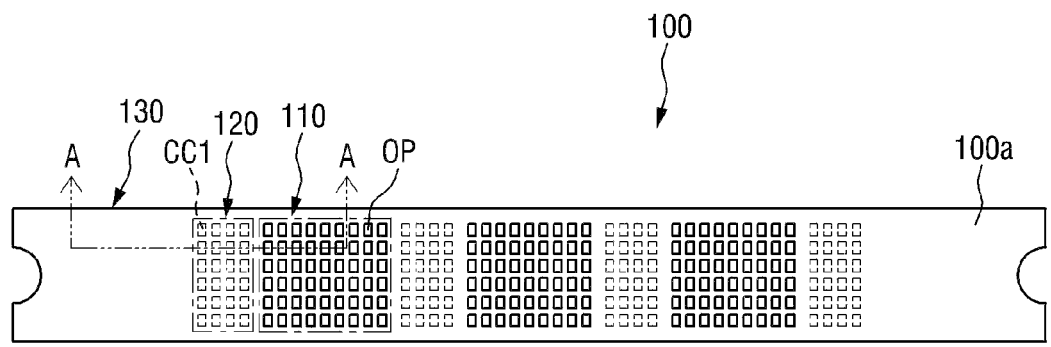
FIG. 2 is a top plan view illustrating the mask for deposition of FIG. 1.
Figure 3:
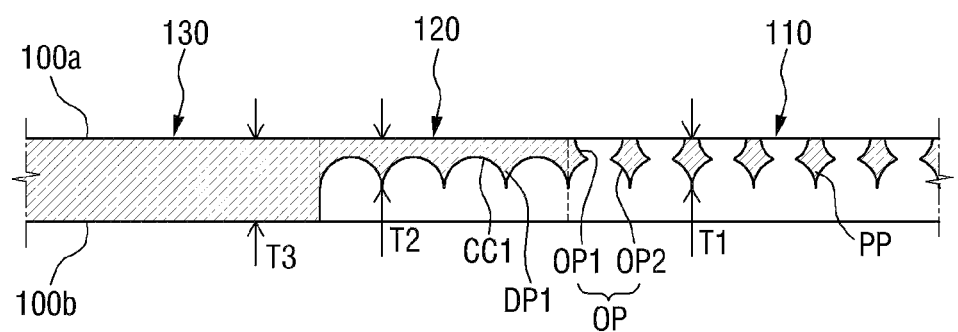
FIG. 3 is a cross-sectional view taken along line A-A of FIG. 2.

FIG. 2 is a top plan view illustrating the mask for deposition of FIG. 1, and FIG. 3 is a cross-sectional view taken along line A-A of FIG. 2.

Referring to FIGS. 2 and 3, the plurality of deposition pattern parts 110 is arranged to be spaced apart from each other at a predetermined interval in a first direction (longitudinal or lengthwise direction) on the mask 100 for deposition. The mask 100 for deposition may include a metal thin plate elongated in the first direction, and having a width in a second direction perpendicular to the first direction.

A plurality of pattern openings OP is defined in each deposition pattern part 110. The plurality of pattern openings OP may provide a path through which a deposition material to be deposited on the substrate (S of FIG. 6) passes. The respective pattern openings OP may include a first pattern opening OP1, and a second pattern opening OP2 disposed under and connected to the first pattern opening OP1. A continuous deposition path is formed by the second pattern opening OP2 disposed under and connected to the first pattern opening OP1.

The first pattern opening OP1 may have a form, of which the width is decreased in a direction from the first surface 100a to the second surface 100b, and may have a first maximum width taken in the first direction. The first maximum width of the first pattern opening OP1 may correspond to, for example, a width of the red organic light emitting layer for each pixel where the red organic light emitting layer among the red organic light emitting layer, the green organic light emitting layer and the blue organic light emitting layer of the organic light emitting diode display is formed on the substrate (S of FIG. 6). The second pattern opening OP2 may have a form, of which the width is decreased in a direction from the second surface 100b to the first surface 100a, and may have a second maximum width larger than the first maximum width of the first pattern opening OP1, taken in the same first direction. The second maximum width of the second pattern opening OP2 may enable the deposition material to be smoothly supplied to the substrate (S of FIG. 6) disposed facing the second pattern opening OP2.

The respective deposition pattern parts 110 may include a plurality of pattern protrusions PP defined by the plurality of second pattern openings OP2. Adjacent pattern protrusions PP define the first and second pattern openings OP1 and OP2 therebetween.

Each pattern protrusions PP may have a maximum thickness T1 taken in a cross-sectional direction of the mask 100 for deposition. The maximum thickness T1 of each pattern protrusions PP may be approximately 40% to 60% of the thickness of the metal thin plate forming the mask 100 for deposition. The maximum thickness T1 of each pattern protrusions PP may be changed by an isotropic etching process in a photolithography process for forming the plurality of pattern openings OP according to an interval between the plurality of pattern openings OP. In one embodiment of forming the mask 100 for deposition, for example, as the interval between the plurality of pattern openings OP is decreased, a region in which one etched portion for forming one pattern opening OP overlaps another etched portion for forming an adjacent pattern opening OP, is increased in the isotropic etching process, so that the maximum thickness T1 of each pattern protrusions PP may be decreased. In FIG. 3, it is illustrated that the maximum thickness T1 of each pattern protrusions PP is decreased by the isotropic etching process for forming the second pattern opening OP2. In FIG. 2, it is illustrated that three deposition pattern parts 110 are arranged in the first direction of the mask 100 for deposition, but the invention is not limited thereto.

The plurality of dummy pattern parts 120 is arranged at opposing sides of the respective deposition pattern parts 110 in the first direction (longitudinal direction).

A plurality of recesses CC1 may be defined in each dummy pattern part 120. The plurality of recesses CC1 may minimize a difference of a volume (or average thickness) between the deposition pattern part 110 and the fixing part 130. Further, the plurality of recesses CC1 may minimize a difference of a volume (or average thickness) between a region between adjacent deposition pattern parts 110 (that is, the region has the same thickness as a maximum thickness T3 of the fixing part 130) and the deposition pattern part 110. In an embodiment of forming the mask 100 for deposition, the plurality of recesses CC1 may be formed when the plurality of second pattern openings OP2 is formed. Accordingly, each recess CC1 may be positioned in the same direction as that of each second pattern opening OP2, that is, in the vertical direction, and may be formed in substantially the same shape as that of each second pattern opening OP2.

Each dummy pattern part 120 may include a plurality of dummy protrusions DP1 defined by the plurality of recesses CC1. Here, protruding surfaces of the plurality of dummy protrusions DP1 may have the same height level as that of a protruding surface of each pattern protrusion PP. That is, the distal ends of the dummy protrusions DP1 and the pattern protrusions PP may be aligned or on substantially a same plane. Distances between the first surface 100a, and the distal ends of the dummy protrusions DP1 and the pattern protrusions PP may be the same as each other.

Each dummy pattern part 120 may have a maximum thickness T2. The maximum thickness T2 of each dummy pattern part 120 may be approximately 40% to 60% of that of the metal thin plate forming the mask 100 for deposition. The maximum thickness T2 of each dummy pattern part 120 may be changed by an isotropic etching process in the photolithography process for forming the plurality of recesses CC1 according to an interval between the plurality of recesses CC1. In one embodiment of forming the mask 100 for deposition, for example, as the interval between the plurality of recesses CC1 is decreased, a region, in which one etched portion for forming one recess CC1 overlaps another etched portion for forming another adjacent recess CC1, is increased in the isotropic etching process, so that the maximum thickness T2 of each deposition pattern part 120 may be decreased. Here, the plurality of second recesses CC1 may be formed when the plurality of pattern openings OP2 is formed, and the maximum thickness T2 of each dummy pattern part 120 may be the same as the maximum thickness T1 of each deposition pattern part 110.

The plurality of fixing parts 130 is disposed at external sides of outermost dummy pattern parts 120 among the plurality of dummy pattern parts 120 in the first direction (longitudinal direction). The plurality of fixing parts 130 is parts of the mask 100 for deposition, which coupled to the mask frame 10 of FIG. 1 such as by welding, and has a thickness which is the same as that of the metal thin plate forming the mask 100 for deposition. Accordingly, the maximum thickness T3 of each fixing part 130 may be larger than each of the maximum thickness T1 of each deposition pattern part 110 and the maximum thickness T2 of each dummy pattern part 120. The maximum thickness T3 may also represent the thickness of the metal thin plate or that of the mask 100 for deposition.

The maximum thicknesses of each deposition pattern part 110, each dummy pattern part 120, and each fixing part 130 will be compared below. The maximum thickness T2 of each dummy pattern part 120 is equal to or larger than the maximum thickness T1 of each deposition pattern part 110, and is smaller than the maximum thickness T3 of each fixing part 130. In one exemplary embodiment, for example, the maximum thickness T2 of each dummy pattern part 120 may be the same as the maximum thickness T1 of each deposition pattern part 110, and may be smaller than the maximum thickness T3 of each fixing part 130.

A volume size relationship for each unit region among the deposition pattern part 110 including the plurality of pattern openings OP and having the maximum thickness T1, each dummy pattern part 120 including the plurality of recesses CC1 and having the maximum thickness T2, and each fixing part 130 having the maximum thickness T3 will be described below.

Figure 4:
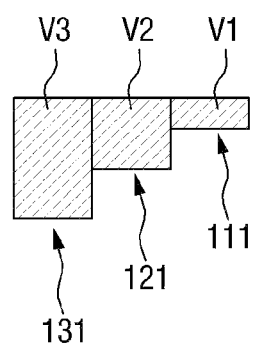
FIG. 4 is a diagram illustrating an embodiment of a relationship between a volume of a first unit region of each deposition pattern part, a volume of a second unit region of each dummy pattern part, and a volume of a third unit region of each fixing part of FIG. 3.

FIG. 4 is a diagram illustrating an embodiment of a size relationship between a volume of a first unit region of each deposition pattern part, a volume of a second unit region of each dummy pattern part, and a volume of a third unit region of each fixing part of FIG. 3.

In FIG. 4, a first unit region 111 (or alternatively referred to as a "second unit region") of the deposition pattern part 110 may represent a region of the mask including one pattern opening OP of the deposition pattern part 110, a second unit region 121 (or alternatively referred to as a "first unit region") of the dummy pattern part 120 may represent a region of the mask including one recess CC1 of the dummy pattern part 120, and a third unit region 131 of the fixing part 130 may represent a region of the mask having the same distance in the first direction as that of the second unit region 121.

A volume of a region of the mask may indicate a volume of material of the mask in the region. At the opening and the recess, the material of the mask is absent. Referring to FIG. 4, a volume V2 of the second unit region 121 of the dummy pattern part 120 may be larger than a volume V1 of the first unit region 111 of the deposition pattern part 110, and may be smaller than a volume V3 of the third unit region 131 of the fixing part 130. That is, it can be seen that the volume is not sharply changed between the fixing part 130 and the deposition pattern part 110, but is gradually changed from the deposition pattern part 110 to the fixing part 130 by stages. Accordingly, it is possible to minimize a generation of a wrinkle at a boundary portion between the deposition pattern part 110 and the fixing part 130 due to a sharp change of the volume between the deposition pattern part 110 and the fixing part 130.

Further, an average thickness size relationship between each deposition pattern part 110 including the plurality of pattern openings OP and having the maximum thickness T1, each dummy pattern part 120 including the plurality of recesses CC1 and having the maximum thickness T2, and each fixing part 130 having the maximum thickness T3 will be described below.

Figure 5:
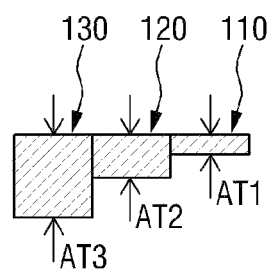
FIG. 5 is a diagram illustrating an embodiment of a size relationship between an average thickness of the deposition pattern part, an average thickness of the dummy pattern part, and an average thickness of the fixing part.

FIG. 5 is a diagram illustrating an embodiment of a size relationship between an average thickness of the deposition pattern part, an average thickness of a dummy pattern part, and an average thickness of a fixing part.

Referring to FIG. 5, an average thickness AT2 of each dummy pattern part 120 may be larger than an average thickness AT1 of each deposition pattern part 110, and may be smaller than an average thickness AT3 of each fixing part 130. That is, it can be seen that the average thickness is not sharply changed, but is gradually changed from the deposition pattern part 110 to the fixing part 130 by stages. Accordingly, generation of a wrinkle at the boundary portion between the deposition pattern part 110 and the fixing part 130 due to the sharp change of the average thickness between the deposition pattern part 110 and the fixing part 130 may be reduced or effectively prevented.

The mask 100 for deposition including the aforementioned configuration is coupled to the mask frame 10 of FIG. 1 such as by welding so that the mask assembly is formed, and then the mask assembly is used for a deposition process.

Figure 6:
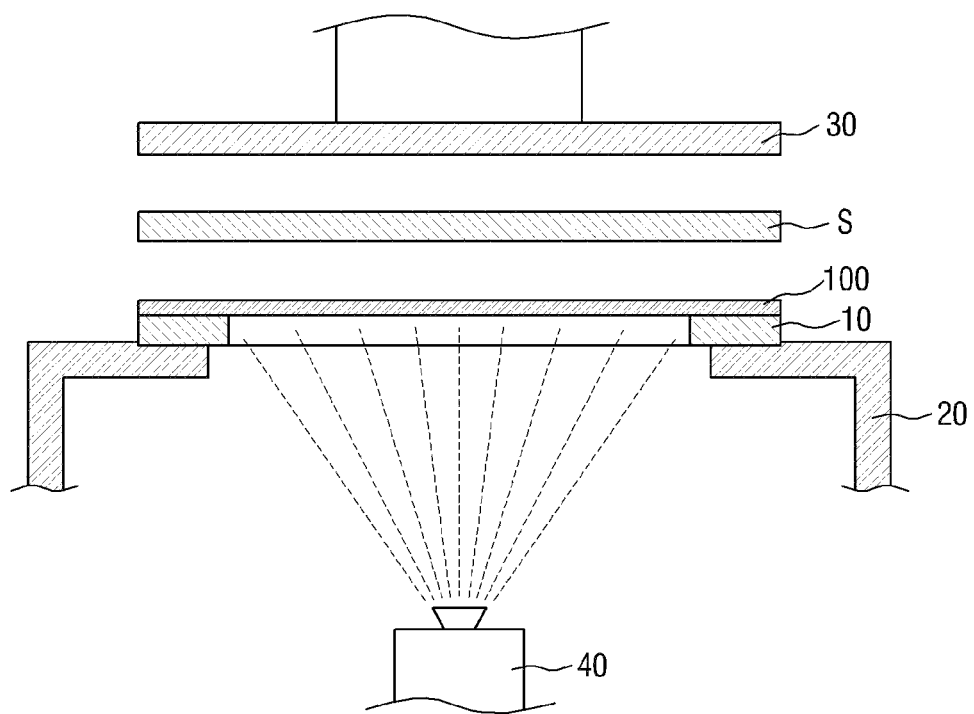
FIG. 6 is a configuration diagram of an embodiment of a deposition apparatus for a deposition process using the mask for deposition of FIG. 1.

FIG. 6 is a configuration diagram of an embodiment of a deposition apparatus for a deposition process using the mask for deposition of FIG. 1.

Referring to FIG. 6, the mask 100 for deposition and the mask frame 10 which are coupled to each other are disposed on a support 20. Further, a magnet unit 30 is driven, so that the substrate S is moved into close contact with the mask 100 for deposition. Since the substrate S is in close contact with the mask 100 for deposition in a state in which the wrinkle between the deposition pattern part 110, the dummy pattern part 120 and the fixing part 130 is minimized, a lifting phenomenon between the mask 100 for deposition and the substrate S may be decreased. Accordingly, where a thin film with a desired pattern is formed by depositing a deposition material on the substrate S from a deposition material supply source 40 through the mask 100 for deposition, the deposition material is further deposited on an external side of the border portion of the thin film corresponding to an area between the deposition pattern part 110 and the fixing part 130, thereby minimizing an occurrence of a shadow phenomenon.

As described above, an embodiment of the mask 100 for deposition according to the invention includes a plurality of deposition pattern parts 110 each including the plurality of pattern openings OP and having the maximum thickness T1, a plurality of dummy pattern parts 120 each including the plurality of recesses CC1 and having the maximum thickness T2, and a plurality of fixing parts 130 each having the maximum thickness T3, so that the volume (or average thickness) is not sharply changed between the part regions, but is gradually changed from the deposition pattern part 110 and the fixing part 130 by stages, and thus generation of a wrinkle due to the sharp difference of the volume (average thickness) between the deposition pattern part 110 and the fixing part 130 is reduced or effectively prevented.

Accordingly, in an embodiment of forming a thin film on a substrate using the mask 100 for deposition according to the invention, the lifting phenomenon between the mask 100 for deposition and the substrate S is decreased in the deposition process, so that when the thin film with a desired pattern is formed by depositing the deposition material on the substrate S, the occurrence of the shadow phenomenon in which a deposition material is further deposited on an external side of a border of the thin film is minimized, thereby decreasing thin film deposition defect of the substrate S.

Next, another embodiment of a mask 200 for deposition according to the invention will be described.

Another embodiment of a mask 200 for deposition according to the invention has the same configuration as that of the mask 100 for deposition of FIG. 1, except for a plurality of dummy pattern parts 220. Accordingly, in the mask 200 for deposition according to the invention, the plurality of dummy pattern parts 220 will be mainly described.

Figure 7:
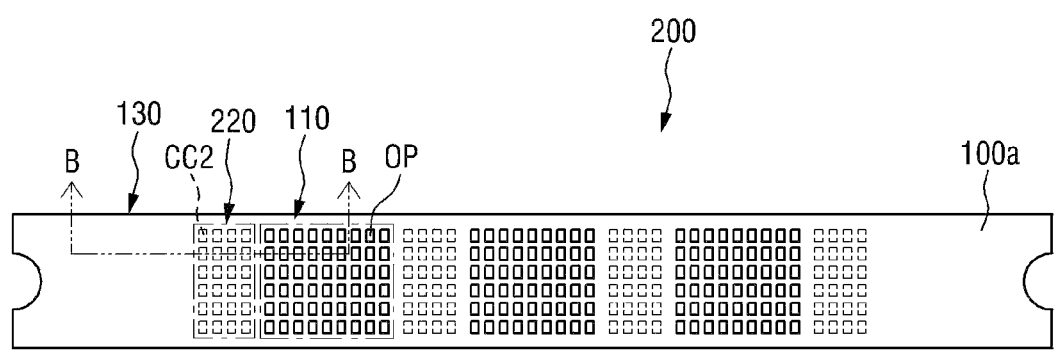
FIG. 7 is a top plan view of another embodiment of a mask for deposition according to the invention.
Figure 8:
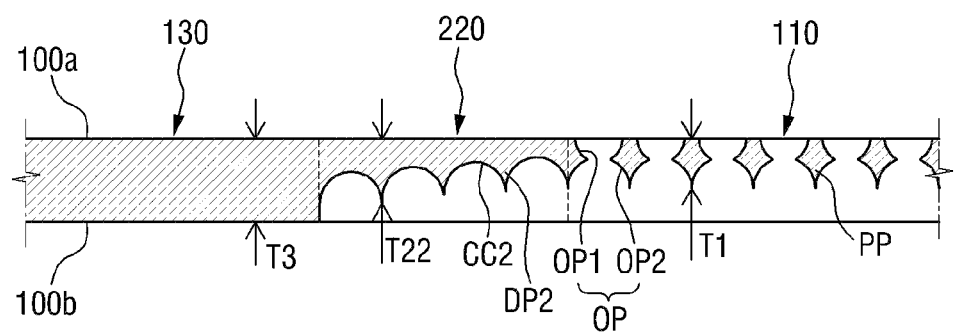
FIG. 8 is a cross-sectional view taken along line B-B of FIG. 7.

FIG. 7 is a top plan view of another embodiment of the mask for deposition according to the invention, and FIG. 8 is a cross-sectional view taken along line B-B of FIG. 7.

Referring to FIGS. 7 and 8, the mask 200 for deposition may include a plurality of deposition pattern parts 110, the plurality of dummy pattern parts 220 and a plurality of fixing parts 130.

The plurality of dummy pattern parts 220 is arranged at opposing sides of the respective deposition pattern parts 110 in a first direction (longitudinal direction).

Each dummy pattern part 220 may include a plurality of recesses CC2. The plurality of recesses CC2 may minimize a difference of a volume (or average thickness) between the deposition pattern part 110 and the fixing part 130. Further, the plurality of recesses CC2 may minimize a difference of a volume (or average thickness) between a region between the adjacent deposition pattern parts 110 (that is, the region has the same thickness as a maximum thickness T3 of the fixing part 130) and the deposition pattern part 110. In an embodiment of forming the mask 200 for deposition, the plurality of recesses CC2 may be formed when a plurality of second pattern openings OP2 is formed. Accordingly, each recess CC2 may be positioned in the same direction as that of each second pattern opening OP2, that is, in the vertical direction, and may be formed in substantially the same shape as that of each second pattern opening OP2.

Each dummy pattern part 220 may include a plurality of dummy protrusions DP2 defined by the plurality of recesses CC2. Here, protruding surfaces (e.g., distal ends) of the plurality of dummy protrusions DP2 have a height level lower than that of a protruding surface (e.g., distal end) of each pattern protrusion PP. The protruding surfaces of the plurality of dummy protrusions DP2 may have a height level increased in a direction from the fixing part 130 to the deposition pattern part 110. The height level may be taken from a plane of the second surface 100b. In other words, distances from the upper surface 100a to the distal ends of the dummy protrusions DP2 may decrease in the direction from the fixing part 130 to the deposition pattern part 110. In an embodiment of forming the mask 200 for deposition, this may be achieved by adjusting a width of an opening of a photo mask disposed at portions, at which the plurality of recesses CC2 is to be formed, such that the widths of the openings are increased in the direction from the fixing part 130 to the deposition pattern part 110 in an exposure process in a photolithography process of forming the plurality of second pattern openings OP2 and the plurality of recesses CC2. A degree of exposure of the dummy pattern part 220 for each region may be changed according to a change of the width of the opening of the photo mask used in forming the mask 200 for deposition, and thus a degree of etching of the dummy pattern part 220 for each region may be changed.

Each dummy pattern part 220 may have a maximum thickness T22. The maximum thickness T22 of each dummy pattern part 220 may be changed by an isotropic etching process in the photolithography process for forming the plurality of recesses CC1 according to an interval between the plurality of recesses CC1. In one embodiment of forming the mask 200 for deposition, for example, as an interval between the plurality of recesses CC2 is decreased, a region, in which one etched portion for forming one recess CC2 overlaps another etched portion for forming another adjacent recess CC2, is increased in the isotropic etching process, so that the maximum thickness T22 of each dummy pattern part 220 may be decreased. Here, the maximum thickness T22 of each dummy pattern part 220 may be larger than a maximum thickness T1 of each deposition pattern part 110.

As described above, a volume size relationship among the unit regions of the deposition pattern part 110 including the plurality of pattern openings OP and having the maximum thickness T1, the dummy pattern part 220 including the plurality of recesses CC2 and having the maximum thickness T22, and the fixing part 130 having the maximum thickness T3 of FIG. 7, is the same as the volume size relationship among the unit regions for the deposition pattern part 110 including the plurality of pattern openings OP and having the maximum thickness T1, the dummy pattern part 120 including the plurality of recesses CC1 and having the maximum thickness T2, and the fixing part 130 having the maximum thickness T3 of, illustrated in FIG. 4.

Further, an average thickness size relationship between the deposition pattern part 110 including the plurality of pattern openings OP and having the maximum thickness T1, the dummy pattern part 220 including the plurality of recesses CC2 and having the maximum thickness T22, and the fixing part 130 having the maximum thickness T3 of FIG. 7 is the same as the average thickness size relationship between the deposition pattern part 110 including the plurality of pattern openings OP and having the maximum thickness T1, the dummy pattern part 120 including the plurality of recesses CC1 and having the maximum thickness T2, and the fixing part 130 having the maximum thickness T3, illustrated in FIG. 4.

As described above, the embodiment of the mask 200 for deposition according to the invention includes the deposition pattern part 110 including the plurality of pattern openings OP and having the maximum thickness T1, the dummy pattern part 220 including the plurality of recesses CC2 and having the maximum thickness T22, and the fixing part 130 having the maximum thickness T3, so that the volume (or average thickness) is not sharply changed, but is gradually changed from the deposition pattern part 110 and the fixing part 130 by stages, and thus a generation of a wrinkle due to the sharp difference of the volume (average thickness) between the deposition pattern part 110 and the fixing part 130 is reduced or effectively prevented.

Accordingly, in an embodiment of forming a thin film on a substrate using the mask 200 for deposition according to the invention, the lifting phenomenon between the mask 200 for deposition and the substrate S is decreased in the deposition process, so that when the thin film with a desired pattern is formed by depositing the deposition material on the substrate S, the occurrence of the shadow phenomenon in which a deposition material is further deposited on an external side of a border of the thin film is minimized, thereby decreasing thin film deposition defect of the substrate S.

Next, yet another embodiment of a mask 300 for deposition according to the invention will be described.

An embodiment of a mask 300 for deposition according to the invention has the same configuration as that of the mask 100 for deposition of FIG. 1, except for a plurality of dummy pattern parts 320. Accordingly, in the embodiment of the mask 300 for deposition, the plurality of dummy pattern parts 320 will be mainly described.

Figure 9:
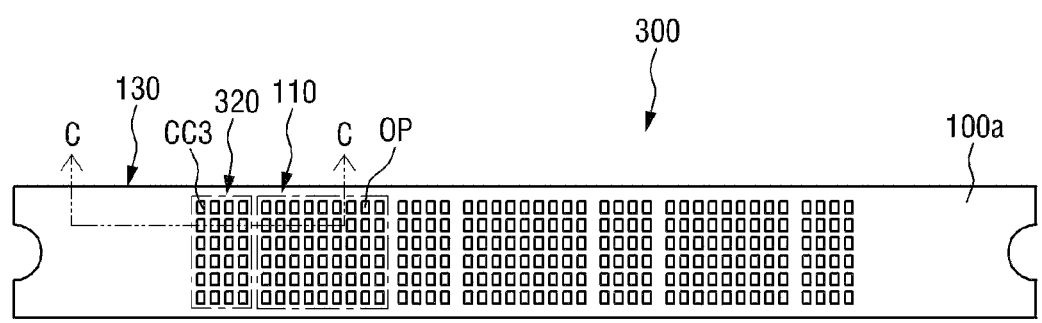
FIG. 9 is a top plan view of yet another embodiment of a mask for deposition according to the invention.
Figure 10:
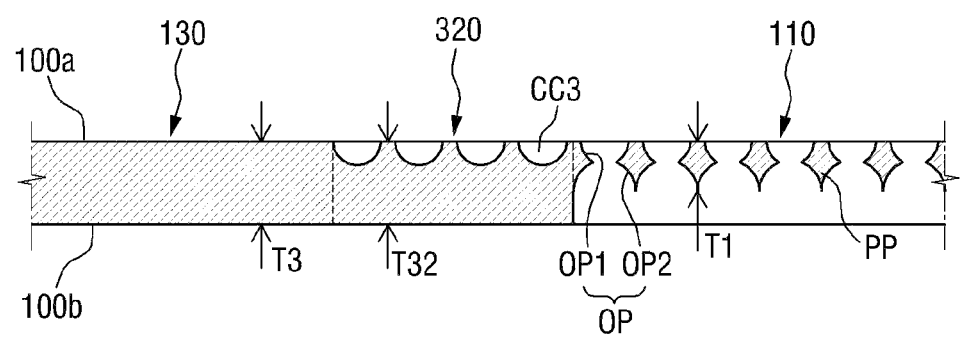
FIG. 10 is a cross-sectional view taken along line C-C of FIG. 9.

FIG. 9 is a top plan view of yet another embodiment of a mask for deposition according to the invention, and FIG. 10 is a cross-sectional view taken along line C-C of FIG. 9.

Referring to FIGS. 9 and 10, the mask 300 for deposition may include a plurality of deposition pattern parts 110, the plurality of dummy pattern parts 320 and a plurality of fixing parts 130.

The plurality of dummy pattern parts 320 is arranged at opposing sides of the respective deposition pattern parts 110 in a first direction (longitudinal direction).

Each dummy pattern part 320 may include a plurality of recesses CC3 extended from the first surface 100*a*. The plurality of recesses CC3 may be open at the first surface 100*a*, where the recesses in FIGS. 3 and 8 are open at the second surface 100*b*. The plurality of recesses CC3 may minimize a difference of a volume (or average thickness) between the deposition pattern part 110 and the fixing part 130. Further, the plurality of recesses CC3 may minimize a difference of a volume (or average thickness) between a region between the adjacent deposition pattern parts 110 (that is, the region has the same thickness as a maximum thickness T3 of the fixing part 130) and the deposition pattern part 110. In an embodiment of forming the mask 300 for deposition, the plurality of recesses CC3 may be formed when the plurality of first pattern openings OP1 is formed. Accordingly, each recess CC3 may be positioned in the same direction as that of each first pattern opening OP1, that is, in the vertical direction, and may be formed in the same shape as that of each first pattern opening OP1.

Each dummy pattern part 320 may have a maximum thickness T32. Here, the maximum thickness T32 of each dummy pattern part 320 may be larger than a maximum thickness T1 of each deposition pattern part 110, and may be the same as the maximum thickness T3 of each fixing part 130.

As described above, a volume size relationship for the unit regions among the deposition pattern part 110 including the plurality of pattern openings OP and having the maximum thickness T1, the dummy pattern part 320 including the plurality of recesses CC3 and having the maximum thickness T32, and the fixing part 130 having the maximum thickness T3 in FIG. 10, is the same as the volume size relationship of the unit regions among the deposition pattern part 110 including the plurality of pattern openings OP and having the maximum thickness T1, the dummy pattern part 120 including the plurality of recesses CC1 and having the maximum thickness T2, and the fixing part 130 having the maximum thickness T3, illustrated in FIG. 4.

Further, an average thickness size relationship between the deposition pattern part 110 including the plurality of pattern openings OP and having the maximum thickness T1, the dummy pattern part 320 including the plurality of recesses CC3 and having the maximum thickness T32, and the fixing part 130 having the maximum thickness T3 of FIG. 10 is the same as the average thickness size relationship between the deposition pattern part 110 including the plurality of pattern openings OP and having the maximum thickness T1, the dummy pattern part 120 including the plurality of recesses CC1 and having the maximum thickness T2, and the fixing part 130 having the maximum thickness T3, illustrated in FIG. 4.

As described above, the embodiment of the mask 300 for deposition according to the invention includes the deposition pattern part 110 including the plurality of pattern openings OP and having the maximum thickness T1, the dummy pattern part 320 including the plurality of recesses CC3 and having the maximum thickness T32, and the fixing part 130 having the maximum thickness T3, so that the volume (or average thickness) is not sharply changed, but is gradually changed from the deposition pattern part 110 and the fixing part 130 by stages, and thus generation of a wrinkle due to the sharp difference of the volume (average thickness) between the deposition pattern part 110 and the fixing part 130 may be reduced or effectively prevented.

Accordingly, in an embodiment of forming a thin film on a substrate using the mask 300 for deposition according to the invention, the lifting phenomenon between the mask 300 for deposition and the substrate S is decreased in the deposition process, so that when the thin film with a desired pattern is formed by depositing the deposition material on the substrate, the occurrence of the shadow phenomenon in which a deposition material is further deposited on an external side of a border of the thin film is minimized, thereby decreasing thin film deposition defect of the substrate S.

Next, still another embodiment of a mask 400 for deposition according to the invention will be described.

Figure 11:
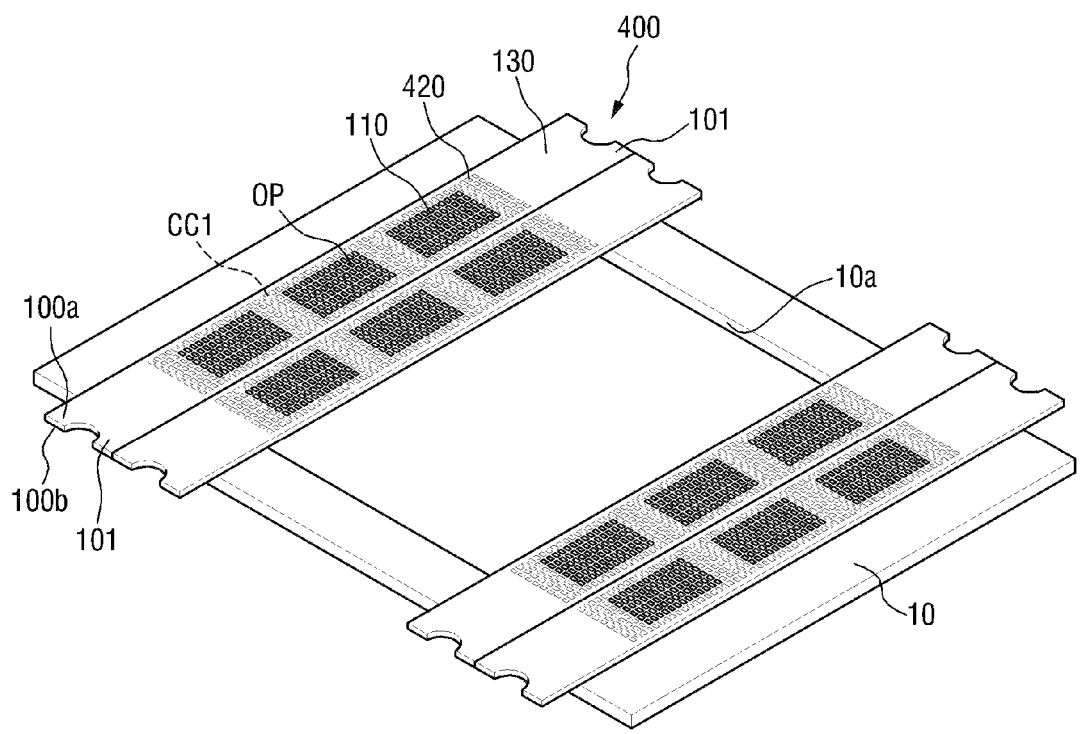
FIG. 11 is a perspective view of another embodiment of a mask for deposition is disposed on a mask frame according to the invention.
Figure 12:
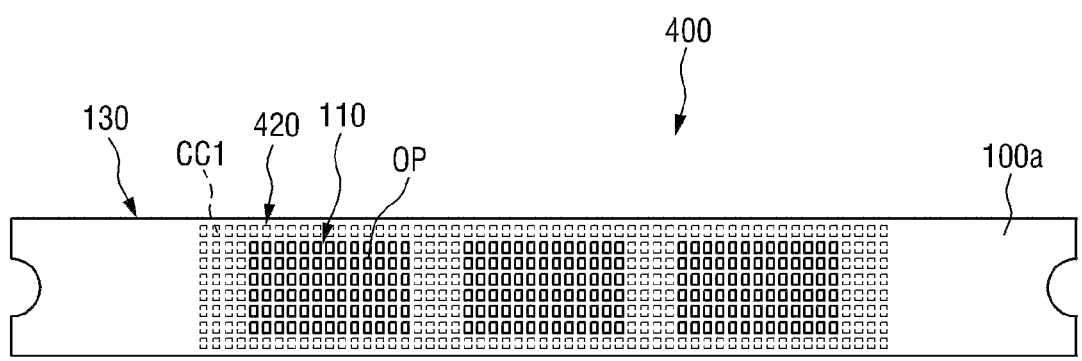
FIG. 12 is a top plan view illustrating the mask for deposition of FIG. 11.

FIG. 11 is a perspective view of another embodiment in which a mask for deposition is disposed on a mask frame according to the invention, and FIG. 12 is a top plan view illustrating the mask for deposition of FIG. 11.

An embodiment of the mask 400 for deposition according to the invention has the same configuration as that of the mask 100 for deposition of FIG. 1, except for a plurality of dummy pattern parts 420. Accordingly, in the embodiment of the mask 400 for deposition according to the invention, the plurality of dummy pattern parts 420 will be mainly described.

Referring to FIGS. 11 and 12, the mask 400 for deposition may include a plurality of deposition pattern parts 110, a plurality of dummy pattern parts 420 and the plurality of fixing parts 130.

The plurality of dummy pattern parts 420 may be similar to the plurality of dummy pattern parts 120 of FIG. 1. However, the plurality of dummy pattern parts 420 may be arranged in a form in which the plurality of dummy pattern parts 120 of FIG. 1 is at opposing sides of the respective deposition pattern parts 110 in the first direction (longitudinal direction) and in a second direction (transverse or width direction), in such a manner that the plurality of dummy pattern parts 120 surround a respective deposition pattern parts 110. As illustrated in FIG. 11 and FIG. 12, the dummy pattern part 420 including the plurality of recesses may be referred to as a single overall area, of which portions are disposed between the deposition pattern parts 110 and lengthwise extended edges of the mask 400, between adjacent deposition pattern parts 110, and between outermost deposition pattern parts 110 and fixing parts 130.

Accordingly, a volume (or average thickness) of the plurality of dummy pattern parts 420 is not sharply changed, but is gradually changed from the deposition pattern part 110 to a peripheral region of the deposition pattern part 110 by stages even in a second direction (width direction) crossing the first direction (longitudinal direction), so that generation of a wrinkle at a border portion between the deposition pattern part 110 and the peripheral region of the deposition pattern part 110 due to a sharp change of the volume (average thickness) between the deposition pattern part 110 and the peripheral region of the deposition pattern part 110 in the second direction (width direction) may be reduced or effectively prevented.

As described above, the embodiment of the mask 400 for deposition according to the invention includes the deposition pattern part 110 including a plurality of pattern openings OP and a maximum thickness (T1 of FIG. 3), the dummy pattern part 420 including a plurality of recesses CC1 and having a maximum thickness (T2 of FIG. 3), and arranged to surround a respective deposition pattern part 110, and the fixing part 130 having a maximum thickness (T3 of FIG. 3), so that the volume (or average thickness) is not sharply changed, but is gradually changed from the deposition pattern part 110 to the fixing part 130 by stages, and the volume (or average thickness) is not sharply changed between the deposition pattern part 110 and the peripheral region of the deposition pattern part 110 in the second direction (width direction), thereby decreasing a generation of a wrinkle due to a sharp difference of the volume (average thickness) between the deposition pattern part 110 and the fixing part 130, and further, decreasing a generation of a wrinkle due to a sharp difference of the volume between the deposition pattern part 110 and the peripheral region of the deposition pattern part 110 in the second direction (width direction).

Accordingly, in an embodiment of forming a thin film on a substrate using the mask 400 for deposition according to the invention, the lifting phenomenon between the mask 400 for deposition and a substrate S is more effectively decreased in a deposition process, so that when the thin film with a desired pattern is formed by depositing the deposition material on the substrate, the occurrence of the shadow phenomenon in which a deposition material is further deposited on an external side of a border of the thin film is minimized, thereby decreasing thin film deposition defect of the substrate S.

As illustrated in FIGS. 11 and 12, the plurality of dummy pattern parts 420 has the same form as that of the plurality of dummy pattern parts 120 of FIGS. 1 to 3, but the invention is not limited thereto. The dummy pattern part 420 surrounding a respective deposition pattern part 110 may have the same form as that of the plurality of dummy pattern parts 220 of FIGS. 7 and 8, and/or may have the same form as that of the plurality of dummy pattern parts 320 of FIGS. 9 and 10.

What is claimed is:

1. A mask for deposition, comprising:
    a plurality of deposition pattern parts arranged spaced apart from each other in a first direction of the mask, and a plurality of pattern openings defined in each deposition pattern part;
    a plurality of dummy pattern parts disposed at opposing sides of each of the plurality of deposition pattern parts in the first direction of the mask, respectively, and each of the dummy pattern parts includes a plurality of recesses arranged in the first direction of the mask; and
    a plurality of fixing parts respectively disposed at external sides of outermost dummy pattern parts among the plurality of dummy pattern parts, in the first direction of the mask,
    wherein
    a maximum thickness of the mask within the each dummy pattern part is equal to or larger than a maximum thickness of the mask within the each deposition pattern part, and the maximum thickness of the mask within the each dummy pattern part is smaller than a maximum thickness of the mask at each fixing part.

2. The mask for deposition of claim 1, wherein the maximum thickness of the mask within the each dummy pattern part is the same as the maximum thickness of the mask within the each deposition pattern part.

3. The mask for deposition of claim 2, wherein the pattern openings comprise:
   first pattern openings open at a first surface of the mask, and
   second pattern openings respectively connected with the first pattern openings, disposed under the first pattern openings in a thickness direction of the mask, and open at a second surface of the mask opposite to the first surface,
   wherein in the thickness direction of the mask, a width of each first pattern opening decreases from the first surface and a width of each second pattern opening decreases from the second surface, and
   the recesses are open at a same surface of the mask as the second pattern openings are open, and have a same shape as the second pattern openings.

4. The mask for deposition of claim 3, wherein the mask defines:
   within the each dummy pattern part, a plurality of dummy protrusions arranged in the first direction of the mask, the dummy protrusions defining the plurality of recesses therebetween and the maximum thickness of the mask within the each dummy pattern part, and
   within the each deposition pattern part, a plurality of pattern protrusions arranged in the first direction of the mask, the pattern protrusions defining the plurality of pattern openings therebetween and the maximum thickness of the mask within the each deposition pattern part, and
   distal ends of the plurality of dummy protrusions are at a same distance from the first surface as those of the plurality of pattern protrusions.

5. The mask for deposition of claim 1, wherein the maximum thickness of the mask within the each dummy pattern part is larger than the maximum thickness of the mask within the each deposition pattern part.

6. The mask for deposition of claim 5, wherein the pattern openings comprise:
   first pattern openings open at a first surface of the mask, and
   second pattern openings respectively connected with the first pattern openings, disposed under the first pattern openings in a thickness direction of the mask, and open at a second surface of the mask opposite to the first surface
   wherein in the thickness direction of the mask, a width of each first pattern opening decreases from the first surface and a width of each second pattern opening decreases from the second surface, and
   the recesses are open at a same surface of the mask as the second pattern openings are open, and have a same shape as the second pattern openings.

7. The mask for deposition of claim 6, wherein the mask defines:
   within the each dummy pattern part, a plurality of dummy protrusions arranged in the first direction of the mask, the dummy protrusions defining the plurality of recesses therebetween and the maximum thickness of the mask within the each dummy pattern part, and
   within the each deposition pattern part, a plurality of pattern protrusions arranged in the first direction of the mask, the pattern protrusions defining the plurality of pattern openings therebetween and the maximum thickness of the mask within the each deposition pattern part, and
   distal ends of the plurality of dummy protrusions are further from the first surface than those of the plurality of pattern protrusions, and a distance of the distal ends of the plurality of dummy protrusions from the first surface decreases in a direction from a fixing part to a deposition pattern part.

8. The mask for deposition of claim 1, wherein a first unit region is a portion of the mask comprising one recess, a second unit region is a portion of the mask comprising one pattern opening, and a third unit region is a portion of a fixing part of the mask having a same length as that of the first unit region in the first direction of the mask, and
   a volume of mask material of the first unit region is larger than a volume of the mask material of the second unit region, and is smaller than a volume of the mask material of the third unit region.

9. The mask for deposition of claim 1, further comprising a plurality of dummy pattern parts disposed at opposing sides of the each of the plurality of deposition pattern parts in a second direction of the mask perpendicular to the first direction of the mask, and a plurality of recesses defined arranged in the first direction of the mask for each dummy pattern part disposed in the second direction.

* * * * *